(12) United States Patent
Terrovitis (10) Patent No.: US 8,786,329 B1
(45) Date of Patent: Jul. 22, 2014

(54) METHOD FOR DOUBLING THE FREQUENCY OF A REFERENCE CLOCK

(71) Applicant: QUALCOMM Incorporated, San Diego, CA (US)

(72) Inventor: Emmanouil Terrovitis, Foster City, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/772,039

(22) Filed: Feb. 20, 2013

(51) Int. Cl.
*H03K 3/017* (2006.01)
*H03K 5/156* (2006.01)

(52) U.S. Cl.
CPC .............. *H03K 5/1565* (2013.01); *H03K 3/017* (2013.01)
USPC .......................................... 327/122; 327/119

(58) Field of Classification Search
CPC ............................. H03K 5/1565; H03K 3/017
USPC ......... 327/116, 113, 119, 120, 121, 122, 261, 327/263, 284
See application file for complete search history.

(56) References Cited

U.S. PATENT DOCUMENTS

| 5,297,179 A | 3/1994 | Tatsumi |
| 5,485,126 A | 1/1996 | Gersbach et al. |
| 5,963,071 A * | 10/1999 | Dowlatabadi ................. 327/175 |
| 6,426,660 B1 * | 7/2002 | Ho et al. ........................ 327/175 |
| 6,654,900 B1 * | 11/2003 | Cave ............................. 713/501 |
| 7,132,863 B2 | 11/2006 | Wadhwa et al. |
| 7,173,464 B2 * | 2/2007 | Nagasue ........................ 327/175 |
| 7,180,340 B2 | 2/2007 | Jung et al. |
| 7,180,342 B1 * | 2/2007 | Shutt et al. .................... 327/122 |
| 7,375,563 B1 | 5/2008 | Cheung et al. |
| 8,121,215 B2 | 2/2012 | Wilhite |
| 8,269,530 B2 | 9/2012 | Tao et al. |
| 2002/0008558 A1 | 1/2002 | Okuda et al. |

FOREIGN PATENT DOCUMENTS

| CN | 102624360 A | 8/2012 |
| DE | 19536195 A1 | 4/1997 |
| WO | WO-2011156771 A2 | 12/2011 |

OTHER PUBLICATIONS

International Search Report and Written Opinion—PCT/US2014/011645—ISA/EPO—May 9, 2014.

* cited by examiner

*Primary Examiner* — Lincoln Donovan
*Assistant Examiner* — Jung H Kim
(74) *Attorney, Agent, or Firm* — Mahamedi Paradice LLP (57) ABSTRACT

A clock multiplier circuit includes a clock generator, a delay element, a logic gate, and a duty cycle correction circuit. The clock generator generates a clock signal. The delay element generates a delayed clock signal in response to the clock signal. The logic gate generates a frequency-multiplied clock signal in response to the clock signal and the delayed clock signal. The duty cycle correction circuit generates an adjustment signal based at least in part on the frequency-multiplied clock signal. The clock generator adjusts a duty cycle of the clock signal in response to the adjustment signal.

26 Claims, 8 Drawing Sheets

METHOD FOR DOUBLING THE FREQUENCY OF A REFERENCE CLOCK

TECHNICAL FIELD

The present embodiments relate generally to frequency synthesizers, and specifically to systems and methods for doubling the frequency of a clock signal.

BACKGROUND OF RELATED ART

Figure 1A:
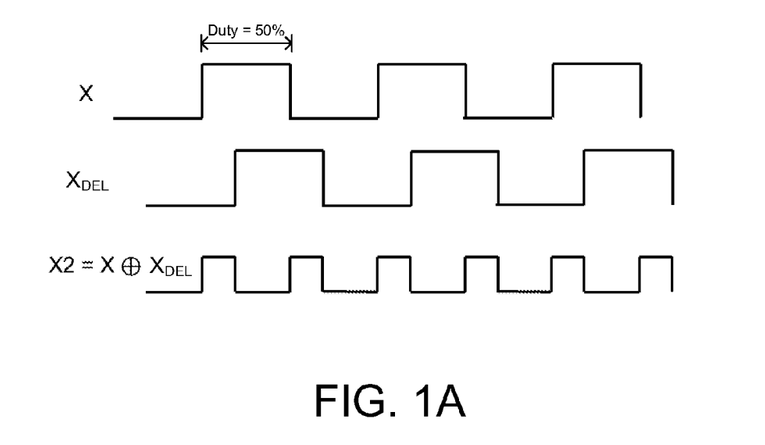
FIGS. 1A-1B depict exemplary timing diagrams of a conventional frequency-doubling operation.

A clock multiplier may be used to increase the frequency of a clock signal. For example, a frequency doubler circuit may generate an output clock transition or edge from both the rising edges and the falling edges of the clock signal, thereby effectively doubling the frequency of the clock signal. For example, FIG. 1A depicts a frequency doubling operation performed by combining a clock signal (X) with a delayed clock signal ($X_{DEL}$) using XOR logic to generate an output clock signal (X2) having a frequency that is double the frequency of the clock signal X.

Figure 1B:
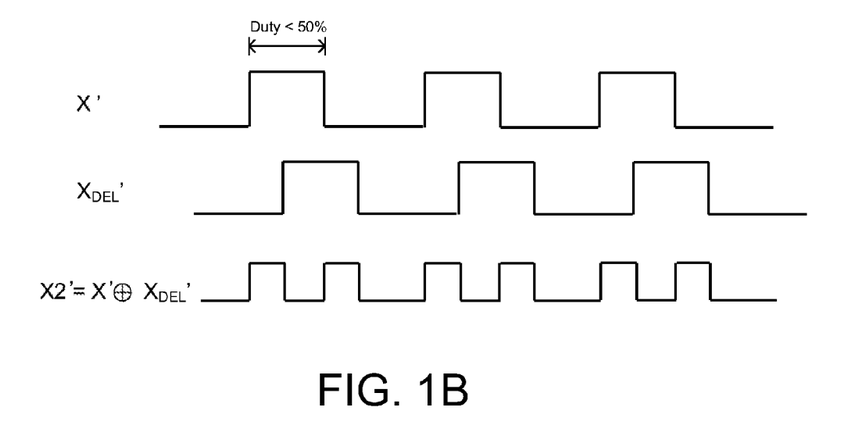

Because the rising and falling edges of the output clock signal X2 are generated in response to transitions in the clock signal X and the delayed clock signal $X_{DEL}$ (which is derived from the clock signal X), the duty cycle of the clock signal X may affect the resulting waveform of the output clock signal X2. More specifically, if the duty cycle of the clock signal X is either greater than or less than 50%, then the period of the output clock signal X2, which may be defined as the time interval between successive edges of the same kind, is not constant but oscillates between two values. For example, FIG. 1B depicts a clock signal X' having a duty cycle that is less than 50%, which in turn results in a delayed clock signal $X_{DEL}$' having a duty cycle that is also less than 50%. When the clock signal X' is combined with the delayed clock signal $X_{DEL}$' in an XOR logic gate, the resulting output clock signal X2' does not have uniformly spaced state transitions or edges, and therefore may not be suitable for use as a clock signal.

SUMMARY

A clock multiplier circuit and method of operation are disclosed that generate a high-frequency clock signal having uniformly spaced clock edges. In accordance with the present embodiments, the clock multiplier circuit may include a clock generator, a delay element, a logic gate, and a duty cycle correction circuit. The clock generator is to generate a clock signal, and includes a control terminal to receive an adjustment signal. The delay element is to generate a delayed clock signal in response to the clock signal. The logic gate is to generate a frequency-multiplied clock signal in response to a combination of the clock signal and the delayed clock signal. The duty cycle correction circuit, which is coupled between the logic gate and the control terminal of the clock generator, is to generate the adjustment signal based at least in part on the frequency-multiplied clock signal. The clock generator is to adjust a duty cycle of the clock signal in response to the adjustment signal.

For at least some embodiments, the duty cycle correction circuit may include a timing loop such as a delay-locked loop (DLL) or a phase-locked-loop (PLL) circuit and a duty cycle controller. The timing loop may use the multiplied clock signal as the reference clock signal. The duty cycle controller is to generate the adjustment signal in response to a first control signal generated by the phase detector of the timing loop. For at least one embodiment, the first control signal includes UP and DN signals generated by a phase detector. In operation, an assertion of a wide UP signal may indicate that an edge of the frequency-multiplied clock signal leads a corresponding edge of the timing loop feedback signal, and an assertion of a wide DN signal may indicate that the edge of the frequency-multiplied clock signal lags the corresponding edge of the timing loop feedback signal.

For at least some embodiments, the duty cycle controller may include a first multiplexer, a second multiplexer, and a charge pump. The first multiplexer may select either the DN signal or the UP signal to provide as a second control signal dutyUP in response to the delayed clock signal, and the second multiplexer may select either the UP signal or the DN signal to provide as a second control signal dutyDN in response to the delayed clock signal. The charge pump selectively adjusts a voltage level of the adjustment signal in response to the second control signals dutyUP and dutyDN. In operation, an assertion of the dutyUP signal may indicate that the duty cycle of the clock signal is less than 50%, and an assertion of the dutyDN signal may indicate that the duty cycle of the clock signal is greater than 50%. Thus, for some embodiments, the charge pump may increase or decrease the voltage level of the adjustment signal when the dutyUP signal is asserted (e.g., for a longer duration than the dutyDN signal), and the charge pump may decrease or increase the voltage level of the adjustment signal when the dutyDN signal is asserted (e.g., for a longer duration than the dutyUP signal). The clock generator may increase or decrease the duty cycle of the clock signal in response to decreases in the voltage level of the adjustment signal, and may decrease or increase the duty cycle of the clock signal in response to increases in the voltage level of the adjustment signal.

BRIEF DESCRIPTION OF THE DRAWINGS

The present embodiments are illustrated by way of example and are not intended to be limited by the figures of the accompanying drawings, where.

DETAILED DESCRIPTION

In the following description, numerous specific details are set forth such as examples of specific components, circuits, and processes to provide a thorough understanding of the present disclosure. The term "coupled" as used herein means connected directly to or connected through one or more intervening components or circuits. Also, in the following description and for purposes of explanation, specific nomenclature is set forth to provide a thorough understanding of the present embodiments. However, it will be apparent to one skilled in the art that these specific details may not be required to practice the present embodiments. In other instances, well-known circuits and devices are shown in block diagram form to avoid obscuring the present disclosure. Any of the signals provided over various buses described herein may be time-multiplexed with other signals and provided over one or more common buses. Additionally, the interconnection between circuit elements or software blocks may be shown as buses or as single signal lines. Each of the buses may alternatively be a single signal line, and each of the single signal lines may alternatively be buses, and a single line or bus might represent any one or more of a myriad of physical or logical mechanisms for communication between components.

Figure 2:
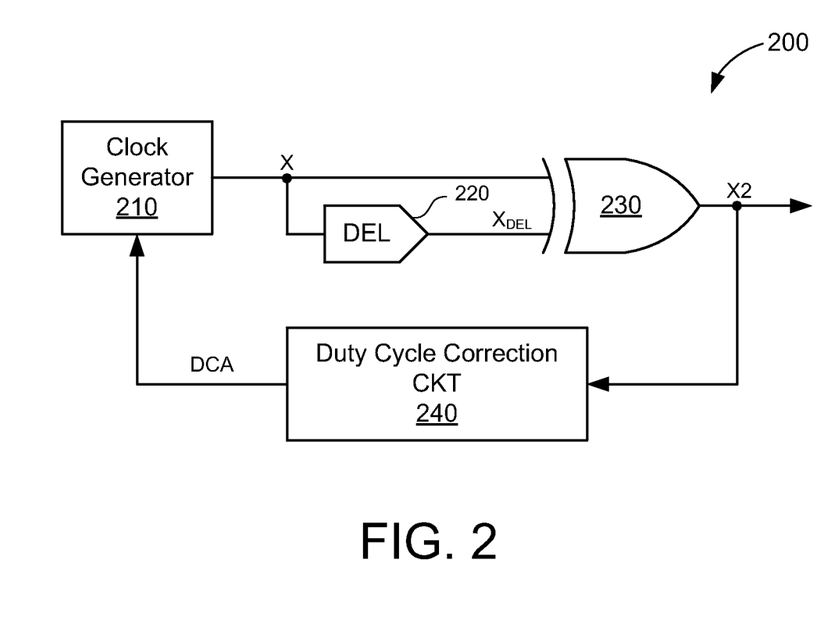
FIG. 2 shows a block diagram of a clock multiplier circuit in accordance with some embodiments.

FIG. 2 shows a block diagram of a clock multiplier circuit 200 in accordance with some embodiments. The clock multiplier circuit 200 includes a clock generator 210, a delay element 220, a logic gate 230, and a duty cycle correction circuit 240. The clock generator 210 generates a clock signal (X). For some embodiments, the clock generator 210 may include a crystal oscillator, although any suitable type of clock generator circuit may be used. The delay element 220 delays the clock signal X to generate a delayed clock signal ($X_{DEL}$). For some embodiments, the delay element 220 may delay the clock signal X by 90 degrees to generate the delayed clock signal $X_{DEL}$. The logic gate 230 logically combines the clock signal X and the delayed clock signal $X_{DEL}$ to generate a frequency-multiplied clock signal (X2). For some embodiments, the logic gate 230 may be an XOR gate, as depicted in FIG. 2, such that the frequency of the frequency-multiplied clock signal X2 is twice the frequency of the clock signal X.

The duty cycle correction circuit 240 receives the frequency-multiplied clock signal X2, and in response thereto generates a duty cycle adjustment (DCA) signal. The clock generator 210 may use the adjustment signal DCA to adjust the duty cycle of the clock signal X. In this manner, the duty cycle correction circuit 240 may create a feedback loop between the logic gate 230 and the clock generator 210 that adjusts (e.g., corrects) the duty cycle of the clock signal X in response to signal characteristics of the frequency-multiplied clock signal X2. For some embodiments, the duty cycle correction circuit 240 may generate the adjustment signal in response to time intervals between successive rising edges and/or falling edges of the frequency-multiplied clock signal X2, as described in greater detail below.

The adjustment signal DCA may be used to adjust the duty cycle of the clock signal X in a number of ways, for example, depending on the application of the clock multiplier 200 and/or the design of the clock generator 210. For at least some embodiments, the adjustment signal DCA may be used to adjust the direct-current (DC) voltage level of an oscillator waveform generated internally by the clock generator 210. For other embodiments, the adjustment signal DCA may be used (e.g., by clock generator 210) to adjust a threshold voltage associated with converting the oscillator waveform into the clock signal X. For other embodiments, the adjustment signal DCA may be used to selectively delay the rising or the falling edges of the clock signal X in order to correct its duty cycle.

By adjusting the duty cycle of the clock signal X in response to the frequency-multiplied clock signal X2, the duty cycle correction circuit 240 may be used to correct the duty cycle of the clock signal X to a desired value (e.g., to 50%) that ensures the edges of the frequency-multiplied clock signal X2 are uniformly spaced. In this manner, the duty cycle correction circuit 240 may detect oscillations in the period of the frequency-multiplied clock signal X2, and then use the detected oscillations to correct the duty cycle of the frequency-multiplied clock signal X2. As a result, the clock multiplier circuit 200 may produce a high frequency clock signal (e.g., frequency-multiplied clock signal X2) with relatively low noise and stable frequency characteristics.

Figure 3:
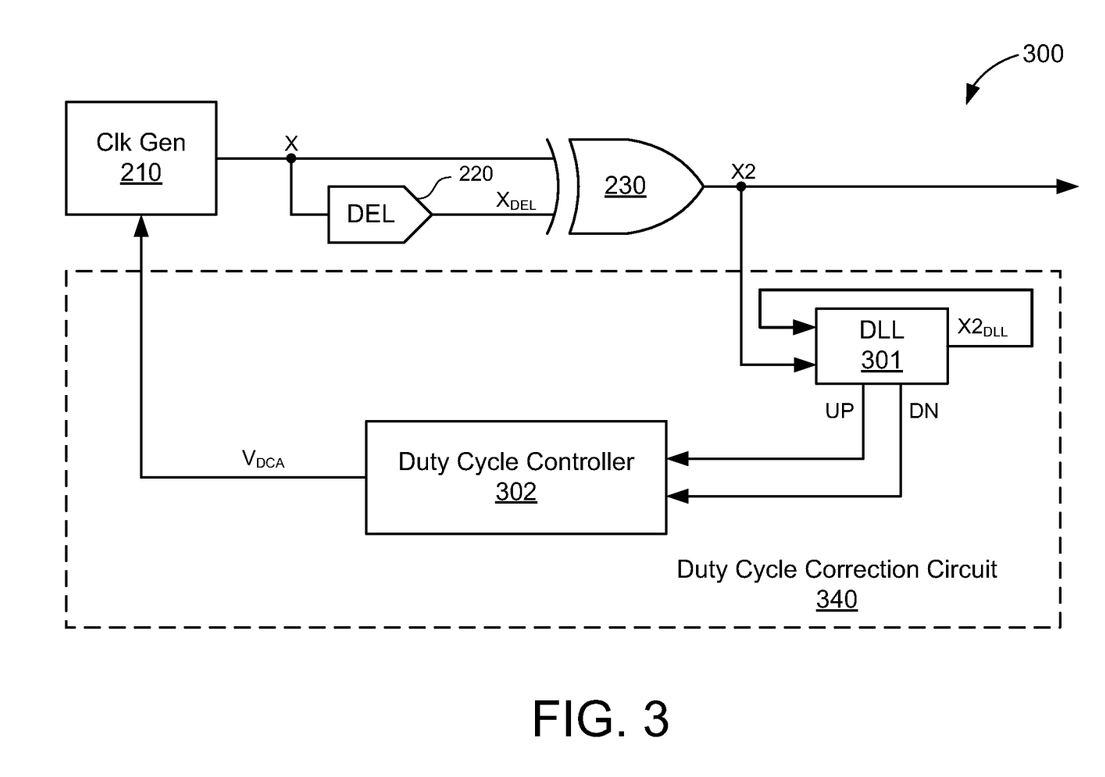
FIG. 3 shows a clock multiplier circuit that is one embodiment of the clock multiplier circuit of FIG. 2.

FIG. 3 shows a clock multiplier circuit 300 that is one embodiment of the clock multiplier circuit 200 of FIG. 2. The clock multiplier circuit 300 includes clock generator 210, delay element 220, logic gate 230, and duty cycle correction circuit 340. As described above with respect to FIG. 2, the clock generator 210 generates the clock signal X, the delay element 220 delays the clock signal X (e.g., by 90 degrees) to generate the delayed clock signal $X_{DEL}$, and the logic gate 230 combines signals X and $X_{DEL}$ to generate the frequency-multiplied clock signal X2.

Duty cycle correction circuit 340, which may be one embodiment of duty cycle correction circuit 240 of FIG. 2, includes a delay-locked loop (DLL) circuit 301 and a duty cycle controller 302. The DLL circuit 301 includes an input to receive the frequency-multiplied clock signal X2, and includes an output to provide a DLL output signal ($X2_{DLL}$). For at least some embodiments, the DLL circuit 301 phase-delays the frequency-multiplied clock signal X2 to generate the DLL output signal $X2_{DLL}$. If successive edges of the frequency-multiplied clock signal X2 are not uniformly spaced (e.g., because the clock signal X has a duty cycle greater than or less than 50%), then the DLL circuit 301 may generate first control signals (UP and DN) that are indicative of a phase difference between respective (rising or falling) edges of the frequency-multiplied clock signal X2 and the DLL output signal $X2_{DLL}$. The duty cycle controller 302 may use the first control signals UP and DN to generate a duty cycle adjustment voltage signal ($V_{DCA}$), which in turn may be used by clock generator 210 to adjust the duty cycle of the clock signal X to a desired value (e.g., to 50%). Thus, for at least some embodiments, the first control signals UP and DN may indicate whether the duty cycle of the clock signal X is to be corrected (and if so, by how much) so that successive edges of the frequency-multiplied clock signal X2 are uniformly spaced.

For one or more embodiments, the DLL circuit 301 may be replaced by a suitable phase-locked loop (PLL) circuit. For example, a PLL circuit may generate the first control signals UP and DN in a manner similar to that of the DLL circuit 301.

Figure 4A:
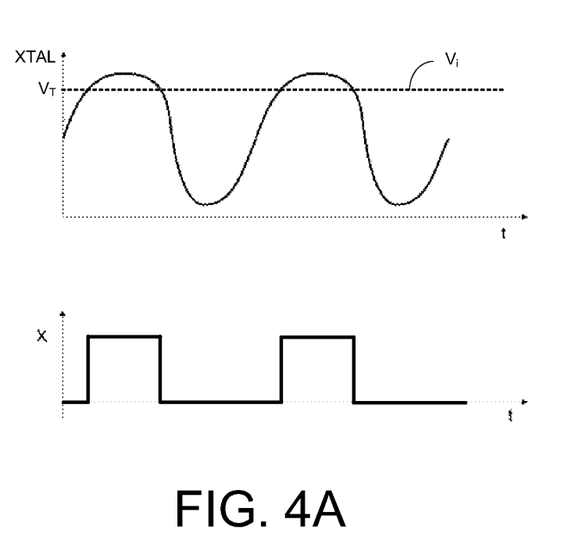
FIGS. 4A-4B depict an exemplary operation for adjusting the duty cycle of a clock signal in accordance with some embodiments.
Figure 4B:
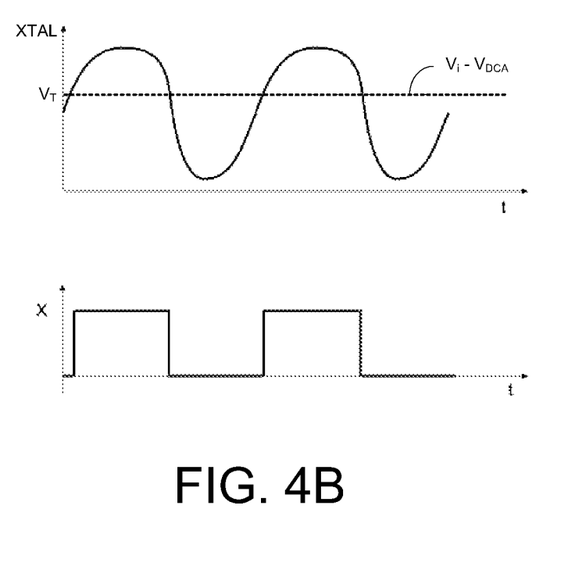

An exemplary operation of clock multiplier circuit 300 for adjusting the duty cycle of the reference clock X is described below with respect to FIGS. 4A-4B. For purposes of discussion herein, the clock generator 210 includes a crystal oscillator (not shown for simplicity) that generates a sinusoidal waveform (XTAL), and includes a conversion circuit (not shown for simplicity) that converts the sinusoidal waveform XTAL into a square waveform suitable for output as the clock signal X. In operation, the clock generator 210 may drive the clock signal X to a logic high state when a voltage level of the sinusoidal waveform XTAL rises above a DC threshold voltage ($V_T$), and may drive the clock signal X to a logic low state when the voltage level of the sinusoidal waveform XTAL drops below the threshold voltage $V_T$. In this manner, the rising and falling edges of the clock signal X may be triggered when the sinusoidal waveform XTAL crosses the DC threshold voltage $V_T$.

The DC threshold voltage $V_T$ may be initially set to an initial voltage level $V_i$, and then subsequently adjusted by an amount corresponding to the adjustment signal $V_{DCA}$ so that clock generator 210 may adjust the duty cycle of the clock signal X to a desired value (e.g., to 50%). For some embodiments, if the duty cycle of the clock signal X is less than 50%, then the duty cycle controller 302 may decrease the voltage level (e.g., to a more negative value) of adjustment signal $V_{DCA}$ so that clock generator 210 increases the duty cycle of the clock signal X. Conversely, if the duty cycle of the clock signal X is greater than 50%, then the duty cycle controller 302 may increase the voltage level (e.g., to a more positive value) of adjustment signal $V_{DCA}$ so that clock generator 210 decreases the duty cycle of the clock signal X. For example, FIG. 4A depicts the DC threshold voltage $V_T$ as being initially set to the initial voltage $V_i$, and depicts the resulting clock signal X having a duty cycle that is less than 50%. FIG. 4B depicts the DC threshold voltage $V_T$ as being adjusted to a value equal to $V_i - V_{DCA}$, and depicts the resulting clock signal X having an adjusted duty cycle that is substantially equal to 50%.

Figure 5:
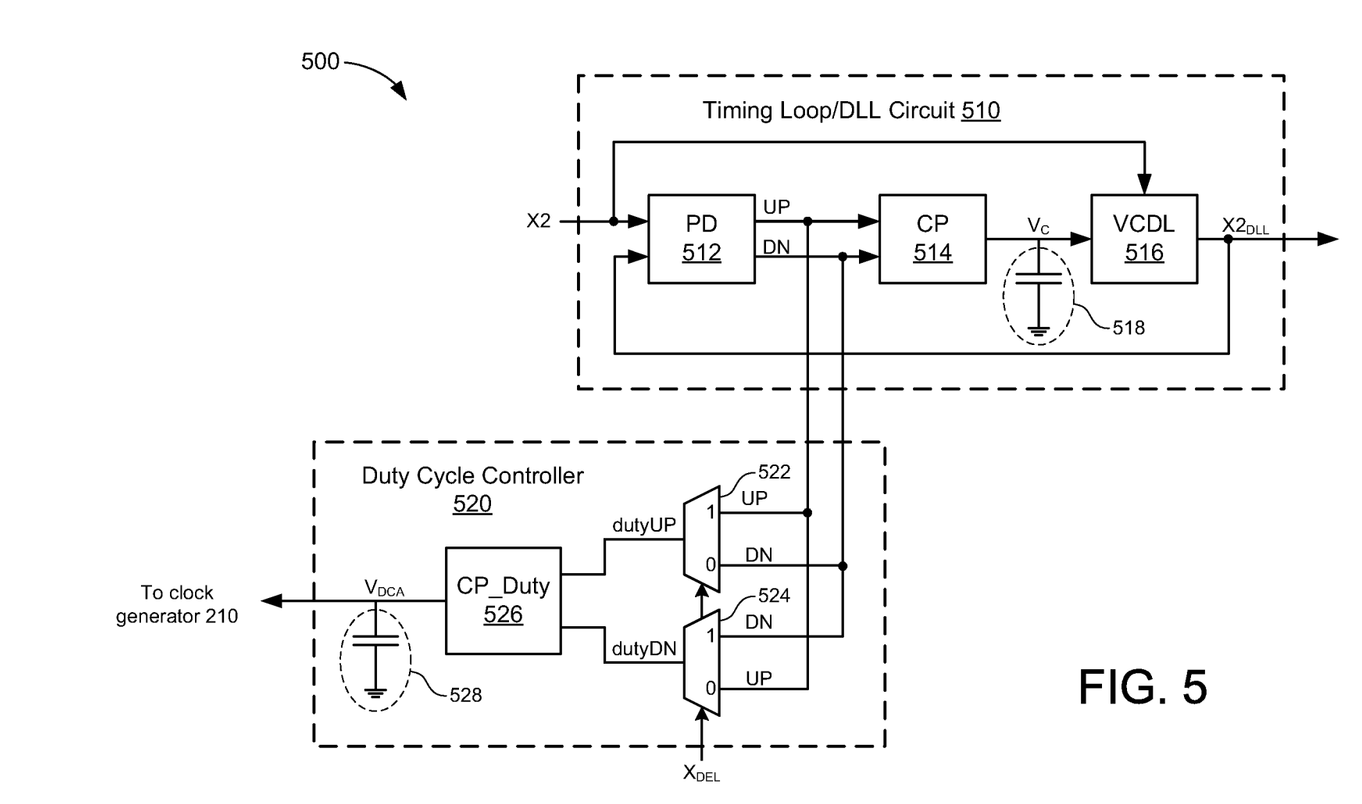
FIG. 5 shows a duty cycle correction circuit in accordance with some embodiments.

FIG. 5 shows a duty cycle correction circuit 500 that is one embodiment of the duty cycle correction circuit 340 of FIG. 3. The duty cycle correction circuit 500 includes a timing loop 510 and a duty cycle controller 520. For the exemplary embodiment of FIG. 5, the timing loop 510 is depicted as a DLL circuit 510; for other embodiments, the timing loop 510 may be a PLL circuit. The DLL circuit 510, which may be one embodiment of DLL circuit 301 of FIG. 3, includes a phase detector (PD) 512, a charge pump (CP) 514, and a voltage-controlled delay line (VCDL) 516. The duty cycle controller 520, which may be one embodiment of duty cycle controller 302 of FIG. 3, includes a first multiplexer 522, a second multiplexer 524, and a duty cycle charge pump (CP_Duty) 526.

In operation, the phase detector 512 compares the relative timing (e.g., the phase difference) between corresponding edges of the frequency-multiplied clock signal X2 and the DLL output signal $X2_{DLL}$, and in response thereto generates the first control signals UP and DN. The charge pump 514 generates a control voltage ($V_C$) in response to the first control signals UP and DN, whereby changes in $V_C$ may be proportional to the phase difference between the frequency-multiplied clock signal X2 and the DLL output signal $X2_{DLL}$. The control voltage $V_C$, which may result from integration of the charge pump current output on a capacitor 518, may cause the VCDL 516 to align the phase of the DLL output signal $X2_{DLL}$ with the phase of the frequency-multiplied clock signal X2. For at least some embodiments, the VCDL 516 may delay the frequency-multiplied clock signal X2 using a series of delay stages (not shown for simplicity) controlled by the control voltage $V_C$ to generate the DLL output signal $X2_{DLL}$.

More specifically, when the phase of frequency-multiplied clock signal X2 lags the phase of the DLL output signal $X2_{DLL}$ (e.g., when the rising edge of signal X2 occurs after the rising edge of signal $X2_{DLL}$), the phase detector 512 may assert the control signal DN for a longer duration than the control signal UP. Conversely, when the phase of the frequency-multiplied signal X2 leads the phase of the DLL output signal $X2_{DLL}$ (e.g., the rising edge of signal X2 occurs before the rising edge of signal $X2_{DLL}$), the phase detector 512 may assert the control signal DN for a shorter duration than the control signal UP The first control signals UP and DN are provided to corresponding inputs of multiplexers 522 and 524, each of which includes a control terminal to receive the delayed clock signal $X_{DEL}$. The multiplexers 522 and 524 selectively output the first control signals UP and DN, as selected by the delayed clock signal $X_{DEL}$, to generate second control signals dutyUP and dutyDN, respectively. Note that the first control signals UP and DN are provided to different inputs of respective multiplexers 522 and 524. For example, when the delayed clock signal $X_{DEL}$ is in a logic high state (e.g., logic 1), multiplexer 522 selects control signal UP to be output as control signal dutyUP, and multiplexer 524 selects control signal DN to be output as control signal dutyDN. Conversely, when the delayed clock signal $X_{DEL}$ is in a logic low state (e.g., logic 0), multiplexer 522 selects control signal DN to be output as control signal dutyUP, and multiplexer 524 selects control signal UP to be output as control signal dutyDN. In this manner, for each clock pulse, a control signal dutyUP wider than control signal dutyDN may indicate a duty cycle of signal X less than 50% and a control signal dutyDN wider than control signal duty UP may indicate a duty cycle of signal X greater than 50%. For some embodiments, the first control signals UP and DN may correlate to sets of rising and falling edges of the clock signal X, as described in more detail below with respect to FIG. 6.

The second control signals dutyUP and dutyDN are provided to inputs of the duty cycle charge pump 526. The charge pump 526 generates the adjustment signal $V_{DCA}$, in response to the second control signals dutyUP and dutyDN, whereby changes in the adjustment signal $V_{DCA}$ may be proportional to a difference between the duty cycle of the clock signal X and a desired duty cycle (e.g., 50%). In response to the adjustment signal $V_{DCA}$, the clock generator 210 (see also FIGS. 2 and 3) may adjust the duty cycle of the clock signal X (e.g., to the desired duty cycle). For example, asserting control signal dutyUP for a longer duration than asserting control signal dutyDN may cause the charge pump 526 to decrease the voltage level of the adjustment signal $V_{DCA}$, which in turn may cause the clock generator 210 to increase the duty cycle of the clock signal X. Conversely, asserting control signal dutyDN for a longer duration than asserting control signal dutyUP may cause the charge pump 526 to increase the voltage level of the adjustment signal $V_{DCA}$, which in turn may cause the clock generator 210 to decrease the duty cycle of the clock signal X. For some embodiments, the adjustment signal $V_{DCA}$ may result from integration of the current output of the charge pump 526 on a capacitor 528.

As mentioned above, for other embodiments, the timing loop 510 may be a PLL circuit (rather than a DLL circuit). For such other embodiments, the voltage-controlled delay line 516 may be replaced with a voltage-controlled oscillator that is to adjust a frequency of the timing loop output signal $X2_{DLL}$ in response to the control voltage $V_C$.

Figure 6:
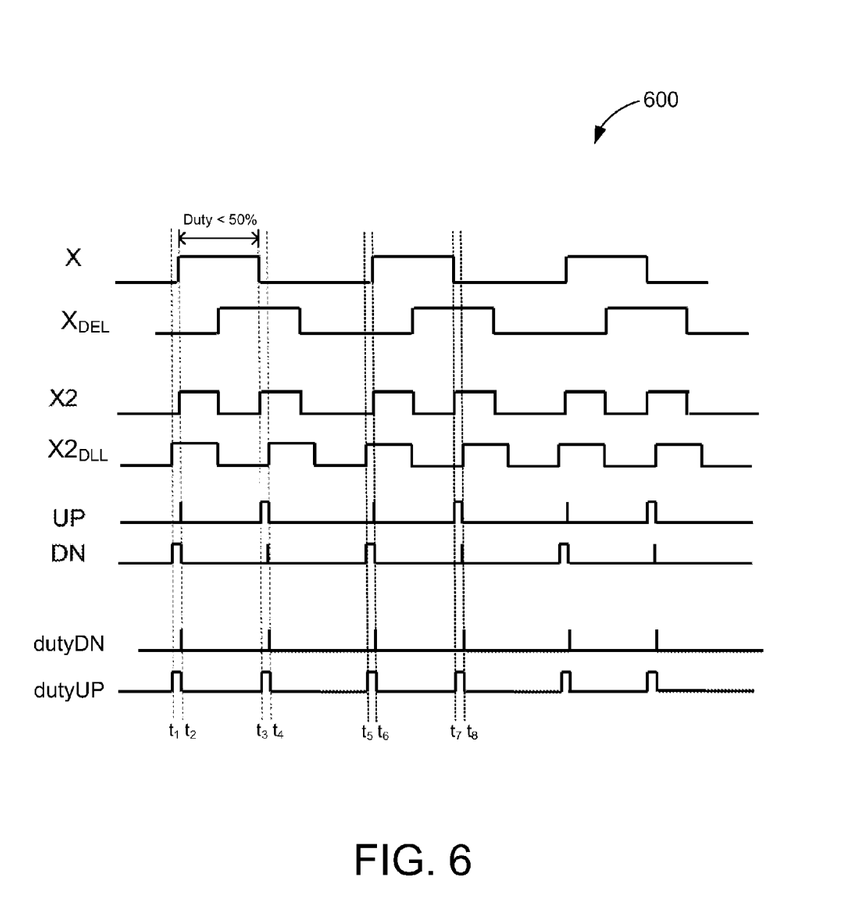
FIG. 6 depicts an exemplary timing diagram of a clock multiplication operation in accordance with some embodiments.

FIG. 6 shows an illustrative timing diagram for an exemplary operation of the duty cycle correction circuit 500 of FIG. 5. Referring also to FIG. 5, the first rising edge of the frequency-multiplied clock signal X2 (at time $t_2$) may correspond with (e.g., may be triggered by) the first rising edge of the clock signal X, and the second rising edge of the frequency-multiplied clock signal X2 (at time $t_3$) may correspond with (e.g., may be triggered by) the first falling edge of the clock signal X. Then, because the phase of the frequency-multiplied clock signal X2 lags the phase of the DLL output signal $X2_{DLL}$ (between times $t_1$ and $t_2$), the phase detector 512 asserts the control signal DN for a longer duration (between times $t_1$ and $t_2$) than it asserts the control signal UP (a narrow pulse at time $t_2$). Note the first control signals UP and DN, which may indicate the phase difference between the frequency-multiplied clock signal X2 and the DLL output signal $X2_{DLL}$, are both in an asserted state at time $t_2$ which may correspond to the first rising edge of the clock signal X). In response to the logic low state of signal $X_{DEL}$, multiplexer 522 passes the control signal DN to as signal dutyUP charge pump 526, and multiplexer 524 passes the control signal UP as signal dutyDN to charge pump 526. Because the asserted pulse width of control signal dutyUP is longer than the asserted pulse width of control signal dutyDN between times $t_1$ and $t_2$, as depicted in FIG. 6, charge pump 526 decreases the voltage level of the adjustment signal $V_{DCA}$, which in turn may cause the clock generator 210 to increase the duty cycle of the clock signal X.

Thereafter, because the phase of the frequency-multiplied clock signal X2 leads the phase of the DLL output signal $X2_{DLL}$ between times $t_3$ and $t_4$, the phase detector 512 asserts the control signal UP for a longer duration (between times $t_3$ and $t_4$) than it asserts the control signal DN (a narrow pulse at time $t_4$). In response to the logic high state of signal $X_{DEL}$, multiplexer 522 passes the control signal UP to as signal dutyUP charge pump 526, and multiplexer 524 passes the control signal DN as signal dutyDN to charge pump 526. Because the asserted pulse width of control signal dutyUP is longer than the asserted pulse width of control signal dutyDN between times $t_3$ and $t_4$, as depicted in FIG. 6, charge pump 526 decreases the voltage level of the adjustment signal $V_{DCA}$, which in turn may cause the clock generator 210 to increase the duty cycle of the clock signal X.

Note that adjustment signal $V_{DCA}$ may be used to adjust the duty cycle (e.g., correct the duty cycle error) of the clock signal X by analog and/or digital circuitry or technique. For example, the adjustment signal $V_{DCA}$ may be used as a digital indicator of whether the duty cycle of the clock signal X is to be increased, decreased, or not adjusted. The duty cycle of the clock signal X may then be corrected in discrete steps by digital means. On the other hand, if the adjustment signal $V_{DCA}$ is used in an analog loop, a low pass filter may be used to eliminate noise.

Figure 7:
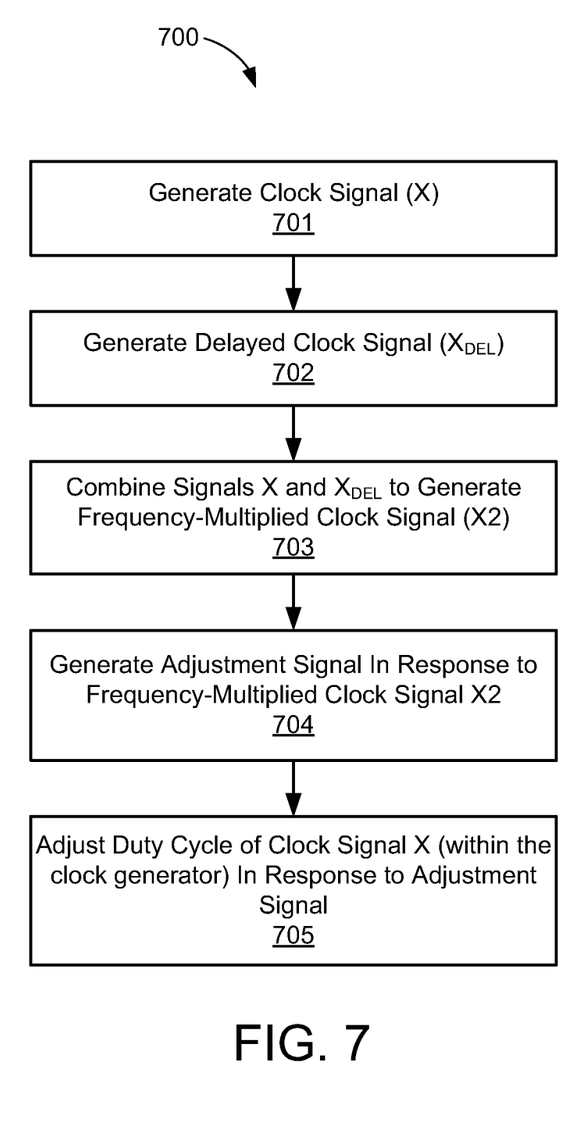
FIG. 7 is an illustrative flow chart depicting an exemplary clock multiplication operation in accordance with some embodiments.

FIG. 7 is an illustrative flow chart depicting an example operation 700 in accordance with some embodiments. As described above, the present embodiments may generate a stable frequency-multiplied clock signal using feedback to control the duty cycle of the original clock signal X. Referring also to FIGS. 2, 3, and 5, the clock signal X is generated by clock generator 210 (701), and then the clock signal X is delayed by delay element 220 to generate the delayed clock signal $X_{DEL}$ (702). For some embodiments, the clock signal X may have relatively low noise and stable frequency characteristics. For some embodiments, the delayed clock signal $X_{DEL}$ may have a 90-degree phase offset relative to the clock signal X.

The clock signal X and the delayed clock signal $X_{DEL}$ are then combined to generate the frequency-multiplied clock signal X2 (703). For example, the clock signal X and the delayed clock signal $X_{DEL}$ may be exclusive –ORed by logic gate 230 to generate the frequency-multiplied clock signal X2 (e.g., such that the frequency of the frequency-multiplied clock signal X2 is double the frequency of the original clock signal X).

Next, an adjustment signal DCA is generated in response to the frequency-multiplied clock signal X2 (704), and then the duty cycle of the clock signal X is adjusted to a desired value in response to the adjustment signal DCA (705). For example, the duty cycle correction circuit 240 may receive the clock signal X2 and generate the adjustment signal DCA in response to signal characteristics of the frequency-multiplied clock signal X2. For some embodiments, the adjustment signal DCA may be used to adjust the DC threshold voltage level of the oscillator waveform created by the clock generator 210, as described with reference to FIGS. 4A-4B. For other embodiments, the adjustment signal DCA may be used to selectively delay the rising or the falling edges of the clock signal X.

By using the frequency-multiplied clock signal X2 to adjust the duty cycle of the clock signal X, the operation 700 may correct the duty cycle of the clock signal X (e.g., to 50%), thereby stabilizing the waveform of the frequency-multiplied clock signal X2 (e.g., so that the edges of the frequency-multiplied clock signal X2 are uniformly spaced). Accordingly, the clock multiplication operation 700 may be used to generate a high frequency clock signal with relatively low noise and stable frequency characteristics.

Figure 8:
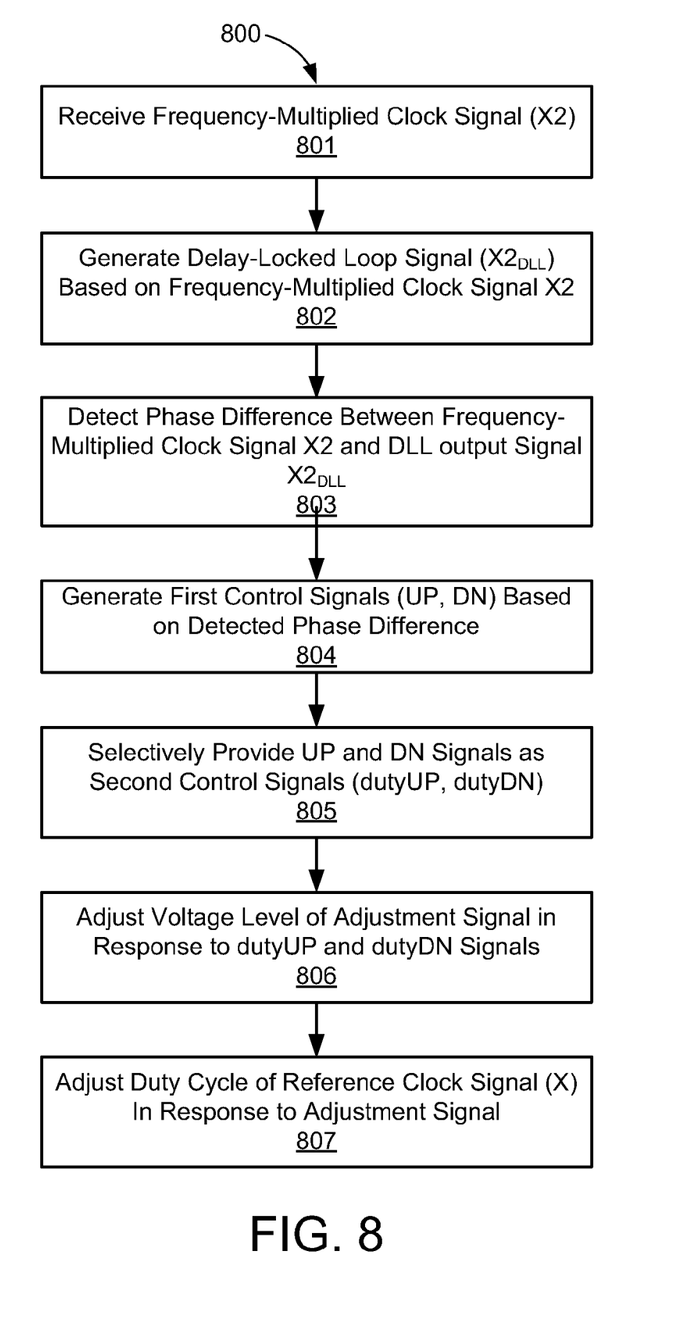
FIG. 8 is an illustrative flow chart depicting an exemplary operation for adjusting the duty cycle of a clock signal in accordance with some embodiments.

FIG. 8 is an illustrative flow chart depicting an example operation 800 of duty cycle correction circuit 500 of FIG. 5 in accordance with some embodiments. First, DLL circuit 510 receives the frequency-multiplied clock signal X2 (801), and then delays the frequency-multiplied clock signal X2 to generate the DLL output signal $X2_{DLL}$ (802). Next, the phase detector 512 detects the phase difference between the frequency-multiplied clock signal X2 and the DLL output signal $X2_{DLL}$ (803), and in response thereto generates the first control signals UP and DN (as well as the control voltage $V_C$) (804). For example, the phase detector 512 may generate the first control signals UP and DN while charge pump 514 and voltage-controlled delay line 516 are to phase-align the DLL output signal $X2_{DLL}$ with the frequency-multiplied clock signal X2. As described above, the first control signals UP and DN may indicate the phase difference between respective edges of the frequency-multiplied clock signal X2 and the DLL output signal $X2_{DLL}$ (e.g., as shown in FIG. 6).

Next, the first control signals UP and DN are selectively provided as the second control signals dutyUP and dutyDN by multiplexers 522 and 524, respectively (805). For example, when the delayed clock signal $X_{DEL}$ is in a logic low state, multiplexer 522 provides the control signal DN as control signal dutyUP to charge pump 526, and multiplexer 524 provides the control signal UP as control signal dutyDN to charge pump 526. Conversely, when the delayed clock signal $X_{DEL}$ is in a logic high state, multiplexer 522 provides the control signal UP as control signal dutyUP to charge pump 526, and multiplexer 524 provides the control signal DN as control signal dutyDN to charge pump 526. For some embodiments, assertion of the control signal dutyUP (e.g., for a longer duration than assertion of the control signal dutyDN) may indicate that the duty cycle of the clock signal X is greater than 50%, and assertion of the control signal dutyDN (e.g., for a longer duration than assertion of the control signal dutyUP) may indicate that the duty cycle is less than 50%.

The second control signals dutyUP and dutyDN may be used to adjust the voltage level of the adjustment signal DCA (806). For example, the charge pump 526 may increase, decrease, or maintain the voltage level of the adjustment signal $V_{DCA}$ in response to the second control signals dutyUP and dutyDN, whereby changes in the voltage level of $V_{DCA}$ may be proportional to the difference between the duty cycle of the clock signal X and the desired duty cycle (e.g., 50%) of the clock signal X. For some embodiments, charge pump 526 may decrease the voltage of adjustment signal $V_{DCA}$ when control signal dutyUP is asserted for a longer duration than control signal dutyDN, and charge pump 526 may increase the voltage of adjustment signal $V_{DCA}$ when control signal dutyDN is asserted for a longer duration than control signal dutyUP.

Finally, the adjustment signal DCA may be used to adjust the duty cycle of the clock signal X (807). For some embodiments, the duty cycle of the clock signal X may be decreased or increased by respectively raising or lowering the clock generator 210's DC voltage or the threshold voltage ($V_T$) of a first buffer (gate) associated with converting the sinusoidal waveform XTAL into a square waveform suitable for output as the clock signal X by an amount indicated by the voltage level of the adjustment signal DCA (e.g., as described above with respect to FIGS. 4A-4B). For other embodiments, the adjustment signal DCA may be used as a digital indicator of whether the duty cycle of the clock signal X is greater than 50% or less than 50%.

It will be appreciated that embodiments described herein may be used to produce a high frequency clock signal with relatively low noise and stable frequency characteristics. Specifically, the use of a feedback loop allows the duty cycle of a clock signal to be corrected in response to timing errors directly detected in the frequency-multiplied output clock signal. The frequency-multiplied clock signal produced in this manner may be used for a variety of applications, including but not limited to, an input clock signal to a frequency synthesizer (e.g., a fractional-N frequency synthesizer).

In the foregoing specification, the present embodiments have been described with reference to specific exemplary embodiments thereof. It will, however, be evident that various modifications and changes may be made thereto without departing from the broader scope of the disclosure as set forth in the appended claims. The specification and drawings are, accordingly, to be regarded in an illustrative sense rather than a restrictive sense. For example, the method steps depicted in the flow charts of FIGS. 7-8 may be performed in other suitable orders and/or multiple steps may be combined into a single step.

What is claimed is:

1. A clock multiplier circuit, comprising:
   a clock generator to generate a clock signal, wherein the clock generator includes a control terminal;
   a delay element to generate a delayed clock signal in response to the clock signal;
   a logic gate to generate a frequency-multiplied clock signal in response to a combination of the clock signal and the delayed clock signal; and
   a duty cycle correction circuit, coupled between the logic gate and the control terminal of the clock generator, to generate an adjustment signal based at least in part on the frequency-multiplied clock signal, wherein the clock generator is to adjust a duty cycle of the clock signal in response to the adjustment signal.

2. The clock multiplier circuit of claim 1, wherein the adjustment signal is to adjust a threshold voltage of the clock generator relative to a direct-current (DC) voltage of an oscillation waveform or to selectively delay an edge of the clock signal until the duty cycle of the clock signal reaches a value of 50% or until a period of the frequency multiplied clock signal is constant.

3. The clock multiplier circuit of claim 1, wherein the duty cycle correction circuit comprises:
   a timing loop to generate an output signal in response to the frequency-multiplied clock signal; and
   a duty cycle controller to generate the adjustment signal in response to a first control signal indicative of a phase difference between the timing loop output signal and the frequency-multiplied clock signal.

4. The clock multiplier circuit of claim 3, wherein the timing loop comprises a delay locked loop (DLL) circuit.

5. The clock multiplier circuit of claim 3, wherein the timing loop comprises:
   a phase detector to generate the first control signal;
   a charge pump to generate a control voltage in response to the first control signal; and
   a voltage-controlled delay line to adjust a phase delay of the timing loop output signal in response to the control voltage.

6. The clock multiplier circuit of claim 3, wherein the first control signal comprises an up signal and a down signal, wherein an assertion of the up signal indicates that an edge of the frequency-multiplied clock signal leads a corresponding edge of the timing loop output signal, and wherein an assertion of the down signal indicates that the edge of the frequency-multiplied clock signal lags the corresponding edge of the timing loop output signal.

7. The clock multiplier circuit of claim 6, wherein the duty cycle controller is to generate a second control signal in response to the up and down signals.

8. The clock multiplier circuit of claim 7, wherein the second control signal comprises a dutyUP signal and a dutyDN signal, wherein an assertion of the dutyUP signal indicates that the duty cycle of the clock signal is less than 50%, and an assertion of the dutyDN signal indicates that the duty cycle of the clock signal is greater than 50%.

9. The clock multiplier circuit of claim 8, wherein the duty cycle controller comprises:
   a first multiplexer to selectively output either the down signal or the up signal as the dutyUP signal in response to the delayed clock signal; and
   a second multiplexer to selectively output either the up signal or the down signal as the dutyDN signal in response to the delayed clock signal.

10. The clock multiplier circuit of claim 9, wherein the first multiplexer outputs the down signal and the second multiplexer outputs the up signal in response to a first logic state of the delayed clock signal, and wherein the first multiplexer outputs the up signal and the second multiplexer outputs the down signal in response to a second logic state of the delayed clock signal.

11. The clock multiplier circuit of claim 9, wherein the duty cycle controller further comprises:
   a charge pump including inputs to receive the dutyUP signal and the dutyDN signal, and including an output to generate the adjustment signal.

12. The clock multiplier circuit of claim 11, wherein the charge pump is to change a voltage of the adjustment signal to increase the duty cycle of the clock signal in response to an assertion of the dutyUP signal, and wherein the charge pump is to change the voltage of the adjustment signal to decrease the duty cycle of the clock signal in response to an assertion of the dutyDN signal.

13. A method for multiplying a frequency of a clock signal, the method comprising:
   generating the clock signal using a clock generator;
   generating a delayed clock signal in response to the clock signal;
   logically combining the clock signal and the delayed clock signal to generate a frequency-multiplied clock signal;
   generating an adjustment signal in response to the frequency-multiplied clock signal and providing the adjustment signal to the clock generator; and
   adjusting a duty cycle of the clock signal, using the clock generator, in response to the adjustment signal.

14. The method of claim 13, wherein the adjustment signal is to adjust a threshold voltage of the clock generator relative to a direct-current (DC) voltage of an oscillation waveform or selectively delay a rising or a falling edge of the clock signal until the duty cycle of the clock signal reaches a value of 50%, or until a period of the frequency multiplied clock signal is constant.

15. The method of claim 13, wherein generating the adjustment signal comprises:
   generating, using a timing loop, a timing loop output signal in response to the frequency-multiplied clock signal;

detecting a phase difference between the timing loop output signal and the frequency-multiplied clock signal; and adjusting a voltage level of the adjustment signal in response to the phase difference.

16. The method of claim 15, further comprising:

asserting an up signal when an edge of the frequency-multiplied clock signal leads a corresponding edge of the timing loop output signal; and asserting a down signal when the edge of the frequency-multiplied clock signal lags the corresponding edge of the timing loop output signal.

17. The method of claim 13, further comprising:

asserting a dutyUP signal when the duty cycle of the clock signal is less than 50%; and asserting a dutyDN signal when the duty cycle of the clock signal is greater than 50%.

18. The method of claim 17, further comprising:

changing a voltage level of the adjustment signal to increase the duty cycle of the clock signal in response to assertion of the dutyUP signal; and changing the voltage level of the adjustment signal to decrease the duty cycle of the clock signal in response to assertion of the dutyDN signal.

19. The method of claim 18, further comprising:

adjusting a threshold voltage of the clock generator relative to a direct-current (DC) voltage of an oscillation waveform to selectively delay an edge of the clock signal by the voltage level of the adjustment signal.

20. A clock multiplier circuit, comprising:

means for generating a clock signal;

means for generating a delayed clock signal in response to the clock signal;

means for logically combining the clock signal and the delayed clock signal to generate a frequency-multiplied clock signal; and means for generating an adjustment signal in response to the frequency-multiplied clock signal and providing the adjustment signal to the means for generating the clock signal, wherein the means for generating the clock signal adjusts a duty cycle of the clock signal in response to the adjustment signal.

21. The clock multiplier circuit of claim 20, wherein the adjustment signal is to adjust a threshold voltage of the clock generator relative to a direct-current (DC) voltage of an oscillation waveform or to selectively delay an edge of the clock signal until the duty cycle of the clock signal reaches a value of 50%, or until a period of the frequency multiplied clock signal is constant.

22. The clock multiplier circuit of claim 21, wherein the means for generating the adjustment signal comprises:

means for generating a timing loop output signal in response to the frequency-multiplied clock signal;

means for detecting a phase difference between the timing loop output signal and the frequency-multiplied clock signal; and means for adjusting a voltage level of the adjustment signal in response to the phase difference.

23. The clock multiplier circuit of claim 22, further comprising:

means for asserting an up signal when an edge of the frequency-multiplied clock signal leads a corresponding edge of the timing loop output signal; and means for asserting a down signal when the edge of the frequency-multiplied clock signal lags the corresponding edge of the timing loop output signal.

24. The clock multiplier circuit of claim 20, further comprising:

means for asserting a dutyUP signal when the duty cycle of the clock signal is less than 50%; and means for asserting a dutyDN signal when the duty cycle of the clock signal is greater than 50%.

25. The clock multiplier circuit of claim 24, further comprising:

means for changing a voltage level of the adjustment signal to increase the duty cycle of the clock signal response to assertion of the dutyUP signal; and means for changing the voltage level of the adjustment signal to decrease the duty cycle of the clock signal in response to assertion of the dutyDN signal.

26. The clock multiplier circuit of claim 25, further comprising:

means for adjusting a threshold voltage of the clock generator relative to a direct-current (DC) voltage of an oscillation waveform to selectively delay an edge of the clock signal by the voltage level of the adjustment signal.

* * * * *